US012754701B2

(12) United States Patent
Guo

(10) Patent No.: US 12,754,701 B2
(45) Date of Patent: Oct. 6, 2026

(54) INTERFACE CIRCUIT AND DISPLAY DEVICE

(71) Applicant: Shenzhen China Star Optoelectronics Semiconductor Display Technology Co., Ltd., Shenzhen (CN)

(72) Inventor: Xipo Guo, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 561 days.

(21) Appl. No.: 18/228,082

(22) Filed: Jul. 31, 2023

(65) Prior Publication Data

US 2024/0378005 A1 Nov. 14, 2024

(30) Foreign Application Priority Data

May 9, 2023 (CN) ......................... 202310520419.9

(51) Int. Cl.

*H04N 21/436* (2011.01)
*G06F 3/14* (2006.01)
*H03K 17/687* (2006.01)
*H04N 21/4363* (2011.01)

(52) U.S. Cl.

CPC ........... *G06F 3/14* (2013.01); *H03K 17/6871* (2013.01); *H04N 21/4363* (2013.01)

(58) Field of Classification Search

None

See application file for complete search history.

(56) References Cited

U.S. PATENT DOCUMENTS

| | | | | |
|---|---|---|---|---|
| 8,638,838 B1 * | 1/2014 | Betts | H04L 7/033 | 375/295 |
| 9,223,727 B2 * | 12/2015 | Wada | G06F 13/00 | |
| 10,789,188 B1 * | 9/2020 | Winter | G06F 13/20 | |
| 2009/0128220 A1 * | 5/2009 | Chen | H03K 17/687 | 327/434 |
| 2010/0007634 A1 * | 1/2010 | Hu | G09G 5/006 | 345/204 |
| 2011/0029791 A1 * | 2/2011 | Hu | G06F 1/26 | 713/300 |
| 2015/0079579 A1 * | 3/2015 | Oliver | G09B 5/08 | 434/362 |
| 2015/0296171 A1 * | 10/2015 | Lakkundi | G06F 1/1632 | 386/200 |

(Continued)

*Primary Examiner* — Mushfikh I Alam

(57) ABSTRACT

An interface circuit and a display device are provided. The interface circuit is for use in the display device. The display device includes a main board and a logic board. The interface circuit includes a video transmission interface, an IIC communication interface, and an isolation circuit. The video transmission interface includes empty pins, allowing video signal transmission between the main board and the logic board. The IIC communication interface is obtained by defining the empty pins, enabling IIC signal transmission between the main board and the logic board. The isolation circuit is electrically connected to the IIC communication interface. The empty pins of the video transmission interface are defined as the IIC communication interface, satisfying the IIC communication requirements between the main board and the logic board, reducing the cost of the interface circuit, and not affecting the original video signal transmission function.

16 Claims, 3 Drawing Sheets

(56) References Cited

U.S. PATENT DOCUMENTS

| | | | | |
|---|---|---|---|---|
| 2018/0035070 | A1* | 2/2018 | Liang | H04N 21/426 |
| 2020/0089183 | A1* | 3/2020 | Kallikuppa | G05B 19/0423 |
| 2021/0020092 | A1* | 1/2021 | Huang | G09G 5/006 |
| 2021/0082335 | A1* | 3/2021 | Sun | G09G 3/2096 |
| 2022/0130300 | A1* | 4/2022 | Zhang | G09G 3/006 |
| 2023/0281527 | A1* | 9/2023 | Cella | G06V 20/17 705/7.17 |
| 2024/0028289 | A1* | 1/2024 | Li | G09G 3/32 |

* cited by examiner

INTERFACE CIRCUIT AND DISPLAY DEVICE

RELATED APPLICATION

This application claims the benefit of priority of Chinese Patent Application No. 202310520419.9 filed on May 9, 2023, the contents of which are incorporated herein by reference in its entirety.

FIELD AND BACKGROUND OF THE INVENTION

The present application relates to a field of display technology, in particular to an interface circuit and a display device.

The eDP (embedded DisplayPort) interface is an internal digital interface based on a DisplayPort architecture and protocol. The eDP interface can realize simultaneous transmission of multiple data, has the advantages of high transmission speed, small size, and low electromagnetic interference, and is widely used in small-sized displays with high integration.

With the development of eDP interface, eDP interface is applied to large-sized 4K liquid crystal displays (LCD). Main boards (System on Chip, SOC boards) and logic boards (timing controllers, TCON boards) of the large-sized 4K LCDs require communication via the Inter-Integrated Circuit (IIC) bus. However, conventional eDP interfaces only support video signal transmission, and cannot meet the IIC communication requirements between the main board and the logic board of the large-sized 4K LCDs.

SUMMARY OF THE INVENTION

The present application provides an interface circuit and a display device wherein multiple empty pins of a video transmission interface are defined as an IIC (Inter-Integrated Circuit) communication interface. This approach not only meets the IIC communication requirements between a main board and a logic board, and reduces the cost of the interface circuit but also ensures that the added IIC signal transmission function to the video transmission interface does not affect the original video signal transmission function.

In a first aspect, the present application provides an interface circuit. The interface circuit is for use in a display device. The display device includes a main board and a logic board, and the interface circuit includes a video transmission interface, an Inter-Integrated Circuit (IIC) communication interface, and an isolation circuit,

- wherein the video transmission interface includes a plurality of empty pins, and video signal transmission is performed between the main board and the logic board through the video transmission interface;
- the plurality of empty pins are defined as the IIC communication interface, and IIC signal transmission is performed between the main board and the logic board through the IIC communication interface; and
- the isolation circuit is electrically connected to the IIC communication interface.

In some embodiments, the IIC communication interface comprises a write protection pin, a serial clock pin, and a serial data pin, the isolation circuit comprises a first isolation circuit and a second isolation circuit, the write protection pin and the serial data pin are electrically connected to the first isolation circuit, and the write protection pin and the serial clock pin are electrically connected to the second isolation circuit.

In some embodiments, the write protection pin includes a first level state and a second level state, wherein when the write protection pin is in the first level state, the main board and the logic board are in an IIC isolation state; when the write protection pin is in the second level state, the main board and the logic board are in an IIC communication state.

In some embodiments, the first isolation circuit includes a capacitor, a resistor, a first field effect transistor, and a second field effect transistor;

- the capacitor is connected in parallel with the resistor;
- one end of the capacitor is electrically connected to the write protection pin, and another end of the capacitor is grounded;
- one end of the resistor is electrically connected to the write protection pin, and another end of the resistor is grounded;
- a gate of the first field effect transistor is electrically connected to the write protection pin, a source of the first field effect transistor is electrically connected to the serial data pin, and a drain of the first field effect transistor is electrically connected to a drain of the second field effect transistor; and
- a gate of the second field effect transistor is electrically connected to the write protection pin, and a source of the second field effect transistor is electrically connected to the logic board.

In some embodiments, the second isolation circuit includes a third field effect transistor and a fourth field effect transistor;

- a gate of the third field effect transistor is electrically connected to the write protection pin, a source of the third field effect transistor is electrically connected to the serial clock pin, and a drain of the third field effect transistor is electrically connected to a drain of the fourth field effect transistor; and
- a gate of the fourth field effect transistor is electrically connected to the write protection pin, and a source of the fourth field effect transistor is electrically connected to the logic board.

In some embodiments, the video transmission interface further comprises a plurality of first pins, the plurality of empty pins are arranged adjacent to each other, and the first pins are arranged on two sides of the plurality of empty pins arranged adjacent to each other, and the first pins are grounded.

In some embodiments, the video transmission interface further includes a power supply terminal and a video transmission terminal, and the first pins and the empty pins are arranged between the power supply terminal and the video transmission terminal.

In some embodiments, the logic board includes a power management chip and a logic processing chip, and the power supply terminal is electrically connected to the power management chip; and

- the video transmission terminal is electrically connected to the logic processing chip.

In some embodiments, the video transmission interface further comprises an auxiliary transmission terminal and a hot plug detection terminal;

- the auxiliary transmission terminal is electrically connected to the logic processing chip; and
- the hot plug detection terminal is electrically connected to the logic processing chip.

In a second aspect, the present application provides a display device. The display device includes a main board, a logic board, and the interface circuit mentioned in the first aspect.

The interface circuit disclosed in the present application comprises a video transmission interface and an IIC communication interface, enabling the interface circuit to have both a video signal transmission function and an IIC signal transmission function. This satisfies the IIC communication requirements between the main board and the logic board of current large-sized 4K liquid crystal displays (LCD). The IIC communication interface is obtained by defining multiple empty pins of the video transmission interface. By multiplexing these empty pins, the IIC signal transmission function can be added to the original video transmission interface, allowing a video transmission line to carry both video and IIC signals. This reduces the number of dedicated signal lines for transmitting IIC data and lowers the cost of the interface circuit. Additionally, the isolation circuit controls the main board and the logic board to switch between an IIC isolation state and an IIC communication state, ensuring that the newly added IIC signal transmission function does not affect the original video signal transmission function.

BRIEF DESCRIPTION OF THE SEVERAL VIEWS OF THE DRAWINGS

In order to more clearly illustrate the technical solutions of the present application, the drawings that need to be used in the description of the embodiments will be briefly introduced below. Obviously, the drawings in the following description are only some of the embodiments of the present application. For those skilled in the art, other drawings can be obtained based on these drawings without creative efforts.

The reference signs are described as follows:

100: video transmission interface; 200: IIC communication interface; 110: empty pin; 120: first pin; 130: power supply terminal; 140: video transmission terminal; 150: auxiliary transmission terminal; 160: hot plug detection terminal; 310: capacitor; 320: resistor; 330: first field effect transistor; 340: second field effect transistor; 350: third field effect transistor; 360: fourth field effect transistor.

DESCRIPTION OF SPECIFIC EMBODIMENTS OF THE INVENTION

The technical solutions of the present application will be clearly and completely described below in conjunction with the accompanying drawings with reference to the embodiments of the present application. Apparently, the described embodiments are only some of the embodiments of the present application, not all of them. Based on the embodiments in the present application, all other embodiments obtained by those skilled in the art without making creative efforts are deemed to fall within the protection scope of the present application.

In the description of the present application, it should be understood that when one element is said to be "connected" to another element, it can be directly connected to another element, or one or more intervening elements may be disposed therebetween. In addition, the terms "first" and "second" are used for illustrative purposes only, and cannot be interpreted as indicating or implying relative importance or implicitly specifying the quantity of indicated technical features. Thus, a feature defined as "first" or "second" may explicitly or implicitly include one or more of said features. In the description of the present application, "multiple" means two or more, unless otherwise specifically defined.

Figure 1:
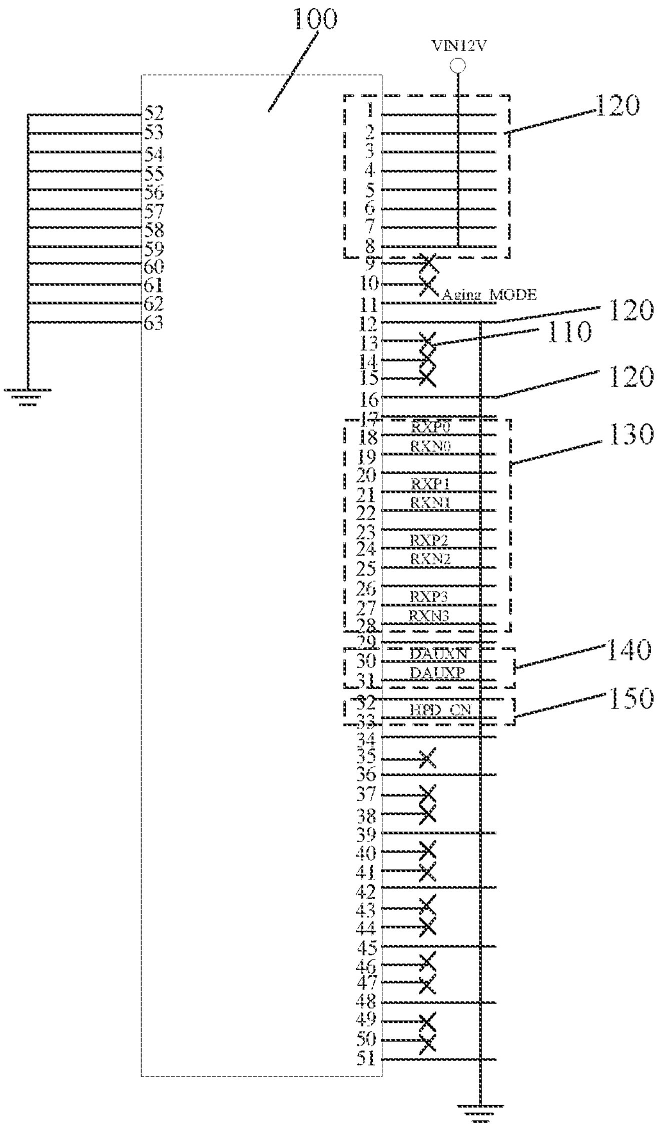
FIG. 1 is a schematic structural diagram of a video transmission interface according to one embodiment of the present application.
Figure 2:
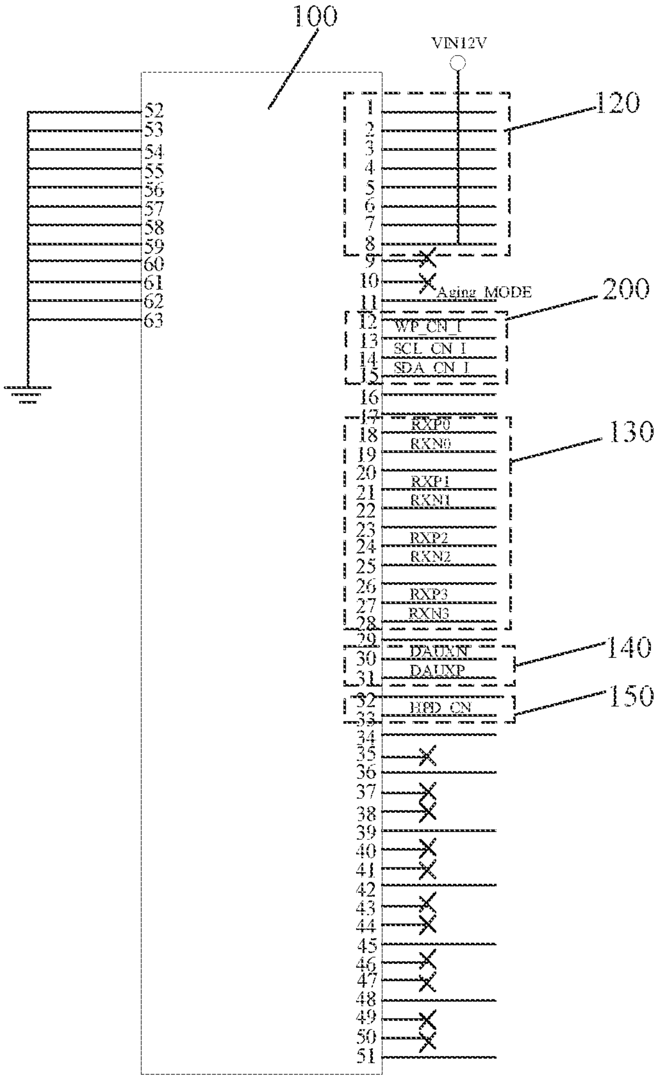
FIG. 2 is a schematic structural diagram of the video transmission interface after empty pins are defined as an Inter-Integrated Circuit (IIC) communication interface according to one embodiment of the present application.
Figure 3:
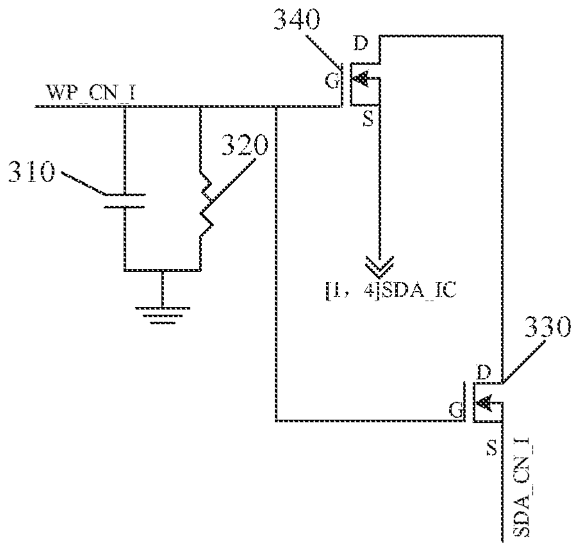
FIG. 3 is a schematic structural diagram of a first isolation circuit according to one embodiment of the present application.
Figure 4:
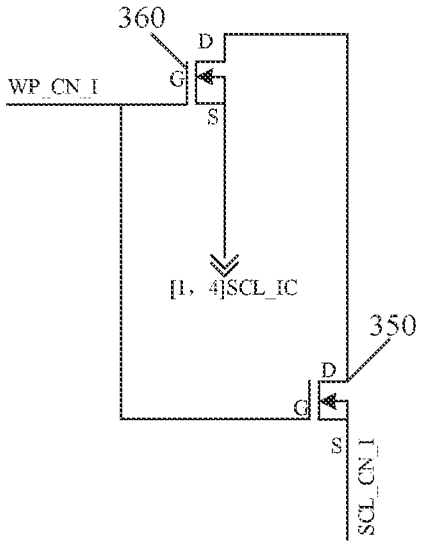
FIG. 4 is a schematic structural diagram of a second isolation circuit according to one embodiment of the present application.

Specifically, please refer to FIGS. 1, 2, 3, and 4. FIG. 1 is a schematic structural diagram of a video transmission interface 100 according to one embodiment of the present application. FIG. 2 is a schematic structural diagram of the video transmission interface 100 after empty pins are defined as an Inter-Integrated Circuit (IIC) communication interface 200 according to one embodiment of the present application. FIGS. 3 and 4 are both a schematic structural diagram of an isolation circuit according to one embodiment of the present application. The present application provides an interface circuit. The interface circuit is for use in a display device. The display device includes a main board (System on Chip board, abbreviated as SOC board) and a logic board (timing controller, or so called TCON board). The main board and the logic board of the display device perform video signal transmission and IIC signal transmission through the interface circuit.

As shown in FIGS. 1, 2, 3, and 4, the interface circuit of the present application includes: the video transmission interface 100, the IIC communication interface 200, and an isolation circuit. The video transmission interface 100 includes a plurality of empty pins 110, allowing video signal transmission between a main board and a logic board through the video transmission interface 100. The IIC communication interface 200 is obtained by defining a plurality of empty pins 110, enabling IIC signal transmission between the main board and the logic board through the IIC communication interface 200. The interface circuit in this embodiment includes both the video transmission interface 100 and the IIC communication interface 200, which can meet the IIC communication requirements between the main board and the logic board of a display device (e.g., a 4K liquid crystal display). Because the IIC communication interface 200 is obtained by defining the empty pins of the video transmission interface 100, by multiplexing the empty pins 110 of the video transmission interface 100, an IIC signal transmission function can be added to the original video transmission interface 100. This allows a video transmission line can transmit both video and IIC signals, reducing the number of dedicated signal lines for IIC data transmission and lowering the costs of the interface circuit.

Considering that adding the IIC signal transmission function to the original video transmission interface 100 may affect the video signal transmission function of the original video transmission interface 100, the interface circuit in this embodiment also includes an isolation circuit. The isolation circuit is electrically connected to the IIC communication interface 200 and is used to control the main board and the logic board to switch between an IIC isolation state and an IIC communication state. In the IIC isolation state, the main board and the logic board are unable to perform IIC signal transmission, whereas in the IIC communication state, the main board and the logic board can perform IIC signal transmission.

Specifically, when the main board and the logic board need to transmit IIC signals, the isolation circuit controls the main board and the logic board to enter the IIC communication state, enabling the normal IIC signal transmission between the main board and the logic board. When the main board and the logic board need to transmit video signals, the isolation circuit controls the main board and the logic board to enter the IIC isolation state, enabling the normal video signal transmission between the main board and the logic board.

In some embodiments, the video transmission interface 100 can be an eDP interface. The empty pins 110 of the eDP interface are defined as the IIC communication interface 200. The IIC communication interface 200 is connected to the isolation circuit, enabling the addition of the IIC signal transmission function to the original cDP interface of the logic board. Accordingly, an eDP line can transmit both video and IIC signals.

In some embodiments, as shown in FIG. 2, the IIC communication interface 200 includes a write protection pin (WP_CN_I), a serial clock pin (SCL_CN_I), and a serial data pin (SDA_CN_I). Accordingly, the specific steps for defining the empty pins to obtain the IIC communication interface are as follows: defining the empty pins as the write protection pin (WP_CN_I), the serial clock pin (SCL-CN-I), and the serial data pin (SDA-CN-I). For example, in FIG. 2, a pin 13 of the video transmission interface is defined as the write protection pin (WP_CN_I), a pin 14 is defined as the serial clock pin (SCL_CN_I), and a pin 15 is defined as the serial data pin (SDA_CN_I).

In some embodiments, as shown in FIGS. 3 and 4, the isolation circuit includes a first isolation circuit and a second isolation circuit. The write protection pin (WP_CN_I) and the serial data pin (SDA_CN_I) are electrically connected to the first isolation circuit, while the write protection pin (WP_CN_I) and the serial clock pin (SCL_CN_I) are electrically connected to the second isolation circuit.

In some embodiments, the write protection pin includes a first level state and a second level state. When the write protection pin is in the first level state, the main board and the logic board are in the IIC isolation state. When the write protection pin is in the second level state, the main board and the logic board are in the IIC communication state.

For example, the first level state is a low voltage level state, while the second level state is a high voltage level state. When the write protection pin is in the low voltage level state, the main board and the logic board are in the IIC isolation mode, and the IIC signal transmission function of the video transmission interface does not affect the video signal transmission function. When the write protection pin is in the high voltage level state, the main board and the logic board are in the IIC communication state, allowing for IIC signal transmission between the logic board and the main board.

Referring to FIG. 3, the first isolation circuit includes a capacitor 310, a resistor 320, a first field effect transistor 330, and a second field effect transistor 340. The capacitor 310 and resistor 320 are connected in parallel. One end of the capacitor 310 is electrically connected to the write protection pin (WP_CN_I), while another end of the capacitor 310 is connected to ground. One end of the resistor 320 of the resistor 320 is electrically connected to the write protection pin (WP_CN_I), while another end of the resistor 320 is connected to ground. A gate of the first field effect transistor 330 is electrically connected to the write protection pin (WP_CN_I), a source of the first field effect transistor 330 is connected to the serial data pin (SDA_CN_I), and a drain is connected to a drain of the second field effect transistor 340. A gate of the second field effect transistor 340 is electrically connected to the write protection pin (WP_CN_I), and a source of the second field effect transistor 340 is connected to a chip on the logic board that receives the serial data signal.

Field effect transistors (FET), also known as field-effect semiconductor transistor, primarily comes in two types: junction field-effect transistor (JFET) and metal-oxide-semiconductor field-effect transistor (MOSFET). FETs can be used as amplifiers, variable resistors, constant current sources, electronic switches, and more. In this embodiment, the first field effect transistor 330 and the second field effect transistor 340 are used as electronic switches.

Specifically, when the write protection pin (WP_CN_I) is in the high level state, the first field effect transistor 330 and the second field effect transistor 340 are turned on, allowing the serial data signal input from the main board to be transmitted through the serial data pin (SDA_CN_I) to the chip on the logic board that receives the serial data signal. When the write protection pin (WP_CN_I) is in the low level state, the first field effect transistor 330 and the second field effect transistor 340 are turned off, preventing the main board and the logic board from transmitting IIC signals.

Referring to FIG. 4, the second isolation circuit includes a third field-effect transistor 350 and a fourth field effect transistor 360. A gate of the third field effect transistor 350 is electrically connected to the write protection pin (WP_CN_I). A source of the third field effect transistor 350 is connected to the serial clock pin (SCL_CN_I), and a drain of the third field effect transistor 350 is connected to a drain of the fourth field effect transistor 360. A gate of the fourth field effect transistor 360 is electrically connected to the write protection pin (WP_CN_I), and a source of the fourth field effect transistor 360 is connected to the chip on the logic board that receives the serial clock signals.

Specifically, the third field effect transistor 350 and the fourth field effect transistor 360 are also used as electronic switches. When the write protection pin (WP_CN_I) is in the high level state, the third field effect transistor 350 and the fourth field effect transistor 360 are turned on, allowing the serial clock signals input from the main board to be transmitted through the serial clock pin to the chip on the logic board that receives the serial clock signal. When the write protection pin (WP_CN_I) is in the low level state, the third field effect transistor 350 and the fourth field effect transistor 360 are turned off, preventing the main board and the logic board from transmitting IIC signals.

In some embodiments, multiple empty pins 110 are arranged adjacent to each other. For example, as shown in FIG. 1 and FIG. 2, the empty pins 110 are pins 13 to 15. Furthermore, the video transmission interface 100 also includes first pins 120 which are positioned on two sides of the adjacent empty pins 110. The first pins 120 are grounded. By arranging the empty pins 110 neighboring to each other and grounding the first pins 120, the IIC bus can be effectively grounded.

In some embodiments, the video transmission interface 100 also includes a power supply terminal 130 and a video transmission terminal 140. For example, as shown in FIG. 2, the video transmission interface 100 includes 63 pins, with pins 1 to 8 designated as the power supply terminal 130, and pins 18 to 28 designated as the video transmission terminal 140.

Furthermore, the first pins 120 and the empty pins 110 are positioned between the power supply terminal 130 and the video transmission terminal 140. For example, as shown in FIG. 2, the multiple empty pins 110 are pins 13 to 15, and the first pins 120 corresponds to pins 12 and 16. This configuration, where the multiple empty pins 110 are placed between the power supply terminal 130 and the video transmission terminal 140, and the first pins 120 are grounded, reduces interference between the video transmission signal and the IIC signal. This prevents any influence on the original video transmission signals.

In some embodiments, the logic board includes a power management chip and a logic processing chip. The power supply terminal 130 is electrically connected to the power management chip to supply power to a screen corresponding to the logic board. The video transmission terminal 140 is connected to the logic processing chip to transmit video signals to the logic processing chip.

In some embodiments, the video transmission interface 100 also includes an auxiliary transmission terminal 150 and a hot plug detection terminal 160. For example, referring to FIGS. 1 and 2, pins 30 to 31 are designated as the auxiliary transmission terminal 150, and pin 33 is designated as the hot plug detection terminal 160. The auxiliary transmission terminal 150 is electrically connected to the logic processing chip to transmit screen parameters and operational status to the logic processing chip. The hot plug detection terminal 160 is electrically connected to the logic processing chip to detect signal connection status.

The present application further provides a display device. The display device includes a main board, a logic board, and the interface circuit of any of the above embodiments.

In summary, the interface circuit of the present application comprises a video transmission interface and an IIC communication interface, enabling the interface circuit to have both a video signal transmission function and an IIC signal transmission function. This satisfies the IIC communication requirements between the main board and the logic board of current large-sized 4K liquid crystal displays (LCD). The IIC communication interface is obtained by defining multiple empty pins of the video transmission interface. By multiplexing these empty pins, the IIC signal transmission function can be added to the original video transmission interface, allowing a video transmission line to carry both video and IIC signals. This reduces the number of dedicated signal lines for transmitting IIC data and lowers the cost of the interface circuit. The isolation circuit controls the main board and the logic board to switch between an IIC isolation state and an IIC communication state, ensuring that the newly added IIC signal transmission function does not affect the original video signal transmission function.

The interface circuit and the display device of the present application are described in detail above. In the present disclosure, specific examples are used to illustrate the principle and embodiments of the present application. The description of the above embodiments is only for ease of understanding technical solutions and the main ideas of the present application. Those skilled in the art can still modify the technical solutions described in the foregoing embodiments, or perform equivalent replacements for some of the technical features. Such modifications or replacements with their respective solutions still fall within the protection scope of the technical solutions of the present application.

What is claimed is:

1. An interface circuit, for use in a display device, the display device comprising a main board and a logic board, the interface circuit comprising a video transmission interface, an Inter-Integrated Circuit (IIC) communication interface, and an isolation circuit, wherein the video transmission interface comprises a plurality of empty pins, and video signal transmission is performed between the main board and the logic board through the video transmission interface;

the plurality of empty pins are defined as the IIC communication interface, and IIC signal transmission is performed between the main board and the logic board through the IIC communication interface; and the isolation circuit is electrically connected to the IIC communication interface;

wherein the IIC communication interface comprises a write protection pin, a serial clock pin, and a serial data pin, the isolation circuit comprises a first isolation circuit and a second isolation circuit, the write protection pin and the serial data pin are electrically connected to the first isolation circuit, and the write protection pin and the serial clock pin are electrically connected to the second isolation circuit;

wherein the write protection pin comprises a first level state and a second level state, wherein when the write protection pin is in the first level state, the main board and the logic board are in an IIC isolation state; when the write protection pin is in the second level state, the main board and the logic board are in an IIC communication state.

2. The interface circuit according to claim 1, wherein the first isolation circuit comprises a capacitor, a resistor, a first field effect transistor, and a second field effect transistor;

the capacitor is connected in parallel with the resistor;

one end of the capacitor is electrically connected to the write protection pin, and another end of the capacitor is grounded;

one end of the resistor is electrically connected to the write protection pin, and another end of the resistor is grounded;

a gate of the first field effect transistor is electrically connected to the write protection pin, a source of the first field effect transistor is electrically connected to the serial data pin, and a drain of the first field effect transistor is electrically connected to a drain of the second field effect transistor; and a gate of the second field effect transistor is electrically connected to the write protection pin, and a source of the second field effect transistor is electrically connected to the logic board.

3. The interface circuit according to claim 1, wherein the second isolation circuit comprises a third field effect transistor and a fourth field effect transistor;

a gate of the third field effect transistor is electrically connected to the write protection pin, a source of the third field effect transistor is electrically connected to the serial clock pin, and a drain of the third field effect transistor is electrically connected to a drain of the fourth field effect transistor; and a gate of the fourth field effect transistor is electrically connected to the write protection pin, and a source of the fourth field effect transistor is electrically connected to the logic board.

4. The interface circuit according to claim 1, wherein the video transmission interface further comprises a plurality of first pins, the plurality of empty pins are arranged adjacent to each other, and the first pins are arranged on two sides of the plurality of empty pins arranged adjacent to each other, and the first pins are grounded.

5. The interface circuit according to claim 4, wherein the video transmission interface further comprises a power supply terminal and a video transmission terminal, and the first pins and the empty pins are arranged between the power supply terminal and the video transmission terminal.

6. The interface circuit according to claim 5, wherein the logic board comprises a power management chip and a logic processing chip, and the power supply terminal is electrically connected to the power management chip; and the video transmission terminal is electrically connected to the logic processing chip.

7. The interface circuit according to claim 6, wherein the video transmission interface further comprises an auxiliary transmission terminal and a hot plug detection terminal;

the auxiliary transmission terminal is electrically connected to the logic processing chip; and the hot plug detection terminal is electrically connected to the logic processing chip.

8. A display device, comprising a main board, a logic board, and an interface circuit, wherein the interface circuit comprises:

a video transmission interface, an Inter-Integrated Circuit (IIC) communication interface, and an isolation circuit, wherein the video transmission interface comprises a plurality of empty pins, and video signal transmission is performed between the main board and the logic board through the video transmission interface;

the plurality of empty pins are defined as the IIC communication interface, and IIC signal transmission is performed between the main board and the logic board through the IIC communication interface; and the isolation circuit is electrically connected to the IIC communication interface;

wherein the IIC communication interface comprises a write protection pin, a serial clock pin, and a serial data pin, the isolation circuit comprises a first isolation circuit and a second isolation circuit, the write protection pin and the serial data pin are electrically connected to the first isolation circuit, and the write protection pin and the serial clock pin are electrically connected to the second isolation circuit;

wherein the write protection pin comprises a first level state and a second level state, wherein when the write protection pin is in the first level state, the main board and the logic board are in an IIC isolation state; when the write protection pin is in the second level state, the main board and the logic board are in an IIC communication state.

9. The display device according to claim 8, wherein the first isolation circuit comprises a capacitor, a resistor, a first field effect transistor, and a second field effect transistor;

the capacitor is connected in parallel with the resistor;

one end of the capacitor is electrically connected to the write protection pin, and another end of the capacitor is grounded;

one end of the resistor is electrically connected to the write protection pin, and another end of the resistor is grounded;

a gate of the first field effect transistor is electrically connected to the write protection pin, a source of the first field effect transistor is electrically connected to the serial data pin, and a drain of the first field effect transistor is electrically connected to a drain of the second field effect transistor; and a gate of the second field effect transistor is electrically connected to the write protection pin, and a source of the second field effect transistor is electrically connected to the logic board.

10. The display device according to claim 8, wherein the second isolation circuit comprises a third field effect transistor and a fourth field effect transistor;

a gate of the third field effect transistor is electrically connected to the write protection pin, a source of the third field effect transistor is electrically connected to the serial clock pin, and a drain of the third field effect transistor is electrically connected to a drain of the fourth field effect transistor; and a gate of the fourth field effect transistor is electrically connected to the write protection pin, and a source of the fourth field effect transistor is electrically connected to the logic board.

11. The display device according to claim 8, wherein the video transmission interface further comprises a plurality of first pins, the plurality of empty pins are arranged adjacent to each other, and the first pins are arranged on two sides of the plurality of empty pins arranged adjacent to each other, and the first pins are grounded.

12. The display device according to claim 11, wherein the video transmission interface further comprises a power supply terminal and a video transmission terminal, and the first pins and the empty pins are arranged between the power supply terminal and the video transmission terminal.

13. The display device according to claim 12, wherein the logic board comprises a power management chip and a logic processing chip, and the power supply terminal is electrically connected to the power management chip; and the video transmission terminal is electrically connected to the logic processing chip.

14. The display device according to claim 13, wherein the video transmission interface further comprises an auxiliary transmission terminal and a hot plug detection terminal;

the auxiliary transmission terminal is electrically connected to the logic processing chip; and the hot plug detection terminal is electrically connected to the logic processing chip.

15. An interface circuit, for use in a display device, the display device comprising a main board and a logic board, the interface circuit comprising a video transmission interface, an Inter-Integrated Circuit (IIC) communication interface, and an isolation circuit, wherein the video transmission interface comprises a plurality of empty pins, a plurality of first pins, a power supply terminal, and a video transmission terminal, and video signal transmission is performed between the main board and the logic board through the video transmission interface, wherein the plurality of empty pins are arranged adjacent to each other, and the first pins are arranged on two sides of the plurality of empty pins arranged adjacent to each other, the first pins are grounded, and the first pins and the empty pins are arranged between the power supply terminal and the video transmission terminal;

the plurality of empty pins are defined as the IIC communication interface, and IIC signal transmission is performed between the main board and the logic board through the IIC communication interface;

the isolation circuit is electrically connected to the IIC communication interface;

wherein the logic board comprises a power management chip and a logic processing chip, and the power supply terminal is electrically connected to the power management chip; and the video transmission terminal is electrically connected to the logic processing chip.

16. The interface circuit according to claim 6, wherein the video transmission interface further comprises an auxiliary transmission terminal and a hot plug detection terminal;

the auxiliary transmission terminal is electrically connected to the logic processing chip; and the hot plug detection terminal is electrically connected to the logic processing chip.

* * * * *